(12) United States Patent
Fujii

(10) Patent No.: US 7,918,640 B2
(45) Date of Patent: Apr. 5, 2011

(54) POSITION CORRECTING APPARATUS, VACUUM PROCESSING EQUIPMENT AND POSITION CORRECTING METHOD

(75) Inventor: Yoshinori Fujii, Susono (JP)

(73) Assignee: Ulvac, Inc., Chigasaki-shi (JP)

( * ) Notice: Subject to any disclaimer, the term of this patent is extended or adjusted under 35 U.S.C. 154(b) by 434 days.

(21) Appl. No.: 12/003,318

(22) Filed: Dec. 21, 2007

(65) Prior Publication Data

US 2008/0175693 A1    Jul. 24, 2008

Related U.S. Application Data

(63) Continuation of application No. PCT/JP2006/312492, filed on Jun. 22, 2006.

(30) Foreign Application Priority Data

Jun. 24, 2005    (JP) ................................. 2005-185488

(51) Int. Cl.
    *B65G 47/24*    (2006.01)
(52) U.S. Cl. ........ 414/754; 414/217; 414/757; 414/784; 414/816; 414/936
(58) Field of Classification Search .................. 414/217, 414/754, 757, 775, 784, 816, 936
See application file for complete search history.

(56) References Cited

U.S. PATENT DOCUMENTS

| | | | | |
|---|---|---|---|---|
| 4,685,206 | A | * | 8/1987 | Kobayashi et al. ............. 29/740 |
| 4,724,621 | A | * | 2/1988 | Hobson et al. .................. 34/218 |
| 5,509,771 | A | * | 4/1996 | Hiroki ........................... 414/217 |
| 6,183,189 | B1 | * | 2/2001 | Lzu et al. ...................... 414/754 |
| 6,222,339 | B1 | * | 4/2001 | Yamasaki et al. ............. 318/685 |
| 6,374,508 | B1 | * | 4/2002 | Yudovsky et al. .............. 33/645 |
| 6,409,463 | B1 | * | 6/2002 | Croft et al. .................... 414/754 |
| 6,554,560 | B2 | * | 4/2003 | Sinha ........................... 414/757 |
| 7,547,181 | B2 | * | 6/2009 | Fukatsu et al. ................ 414/757 |
| 7,618,225 | B2 | * | 11/2009 | Chen et al. ............... 414/416.03 |
| 2002/0172585 | A1 | * | 11/2002 | Graf et al. ..................... 414/757 |

FOREIGN PATENT DOCUMENTS

| | | |
|---|---|---|
| JP | 58-18713 | 2/1983 |
| JP | 2-142158 | 5/1990 |
| JP | 4-154146 | 5/1992 |
| JP | 11-145241 | 5/1999 |

* cited by examiner

*Primary Examiner* — Michael S Lowe
(74) *Attorney, Agent, or Firm* — Kratz, Quintos & Hanson, LLP

(57) ABSTRACT

A technology to resolve positional deviations without using a transport robot. An object to be transported placed on a holding stand is rotated, so as to make an error angle α to be zero; and thereafter, a temporarily placing portion is made to move obliquely to move for an error distance in a horizontal component, thereby locating the center of the object to be transported on the central axis line of the holding stand; and the object to be transported is placed on holding stand. In a case where an orientation of a notch is definite, the holding stand is further rotated by a desired amount. Without using the transport robot, it is possible to resolve an error angle and an error distance.

14 Claims, 11 Drawing Sheets

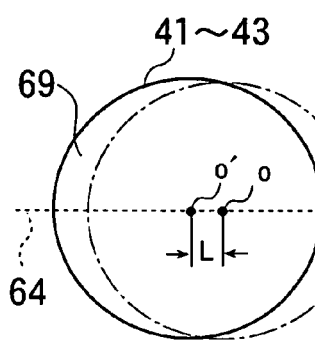
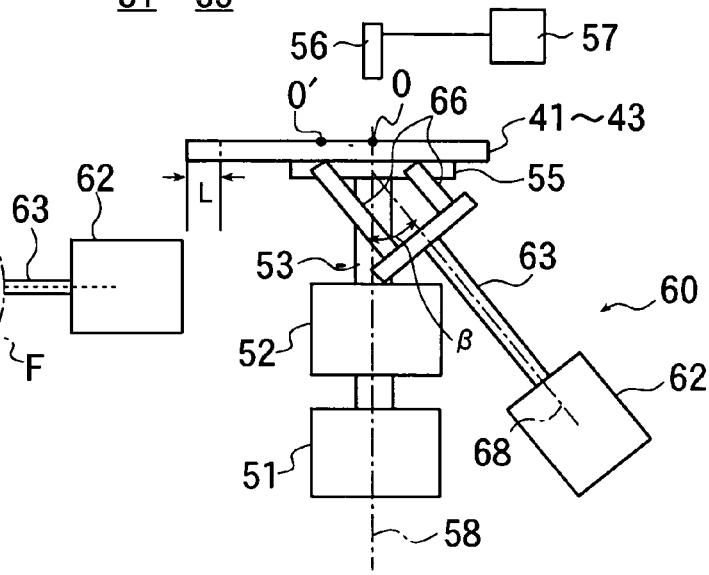
Fig. 4(a)　　　Fig. 4(b)
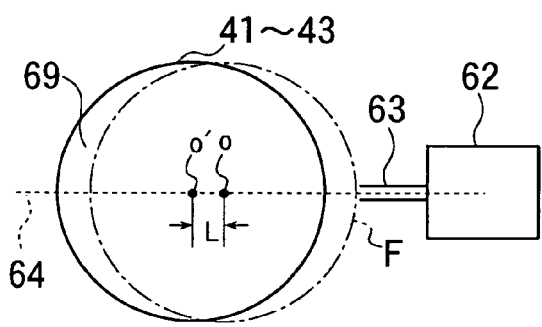
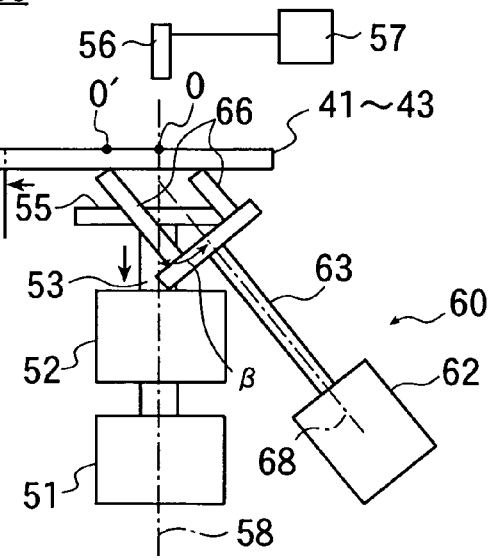
Fig. 5(a)　　　Fig. 5(b)

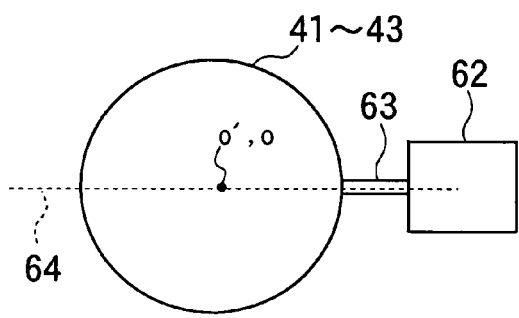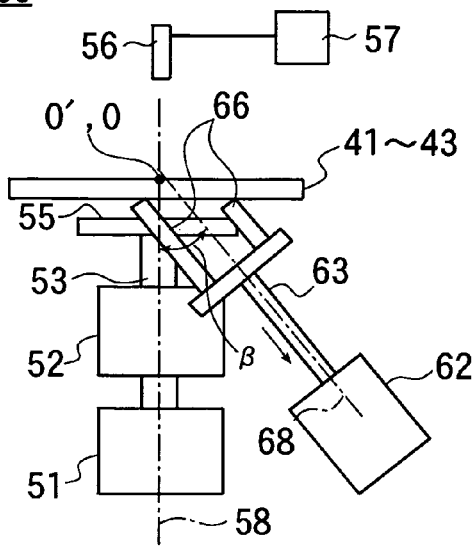
Fig. 6(a)　　Fig. 6(b)
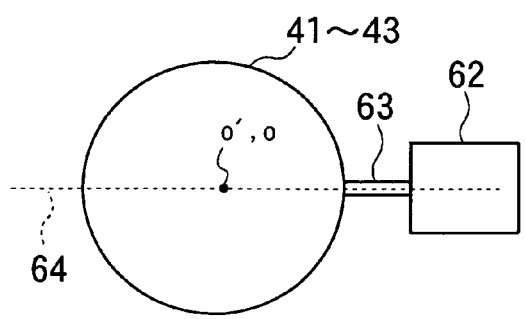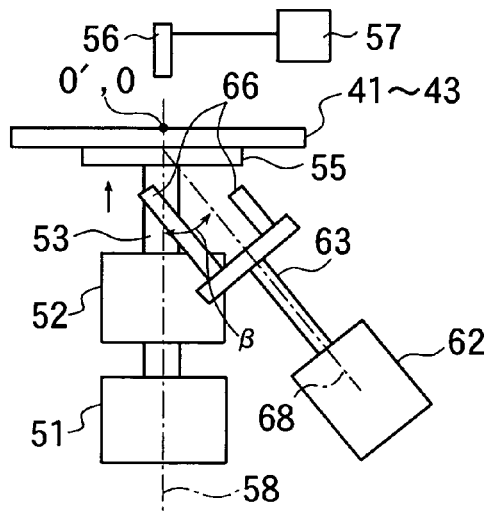
Fig. 7(a)　　Fig. 7(b)

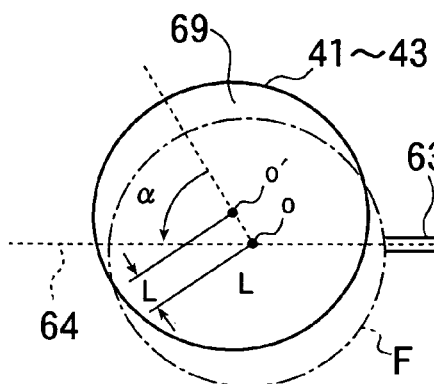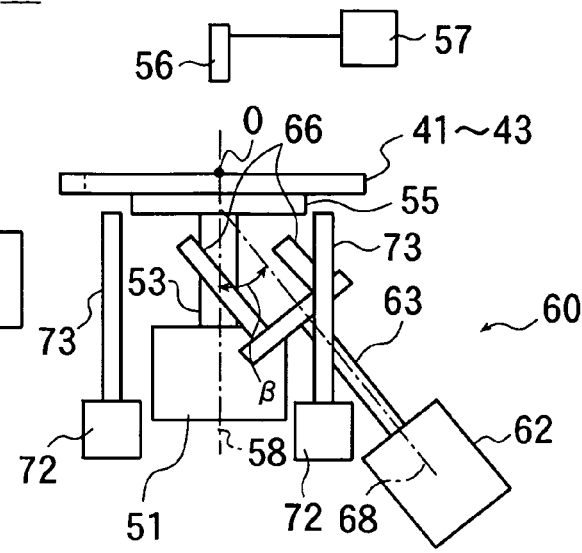
Fig. 8(a)　　　　Fig. 8(b)
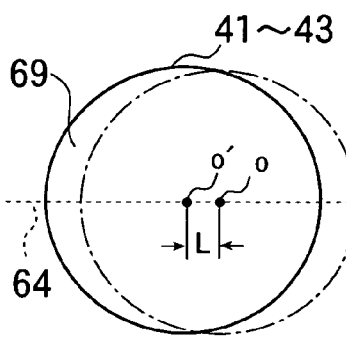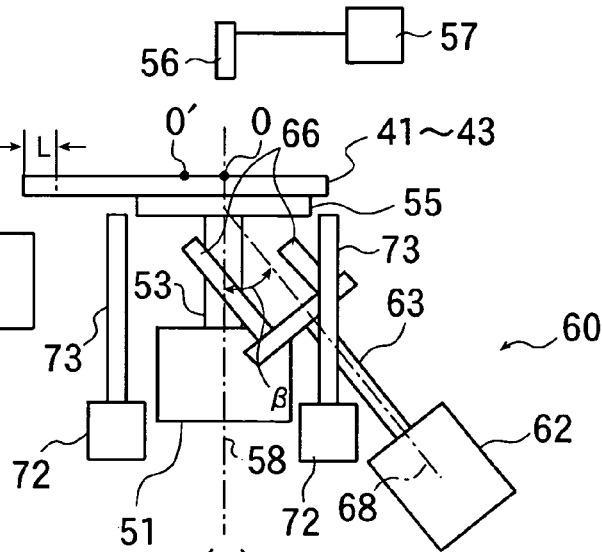
Fig. 9(a)　　　　Fig. 9(b)

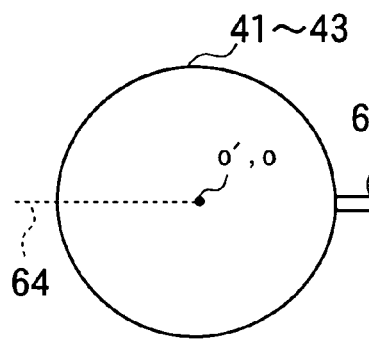
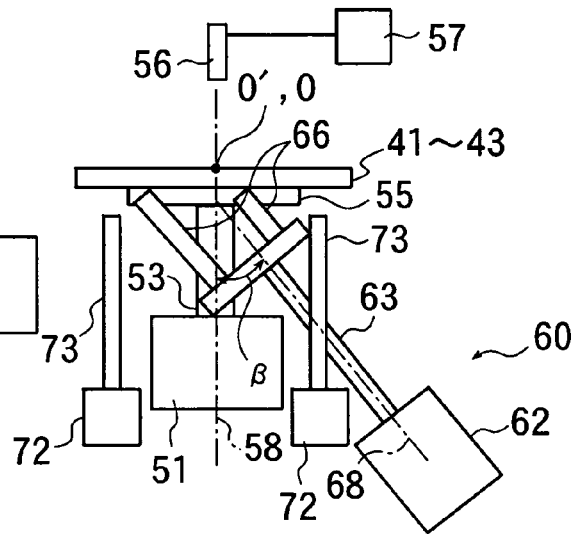
Fig. 12 (a)   Fig. 12(b)
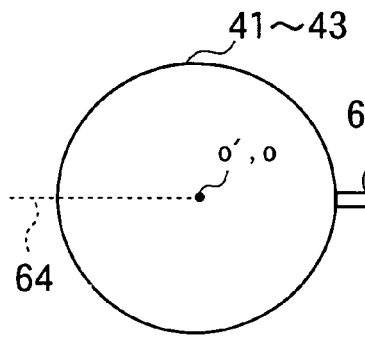
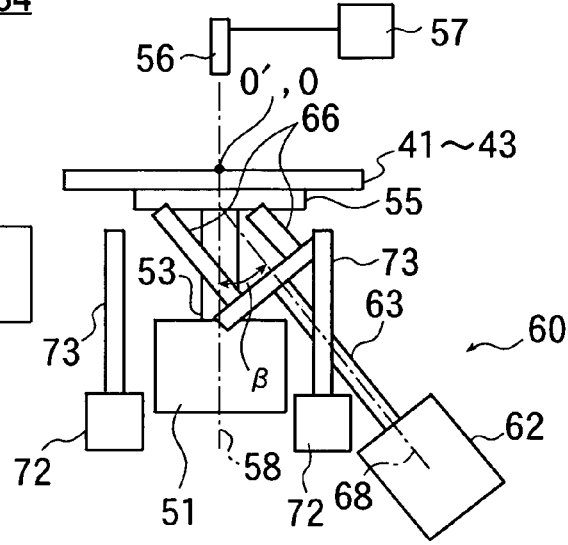
Fig. 13 (a)   Fig. 13 (b)

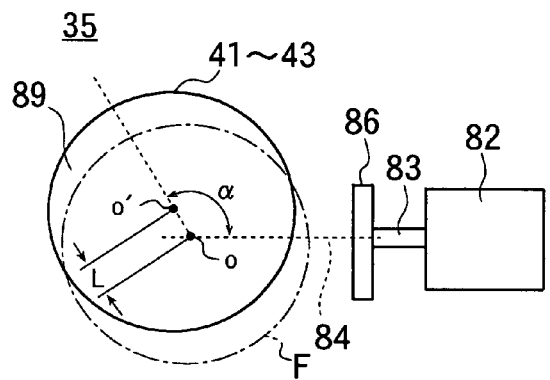
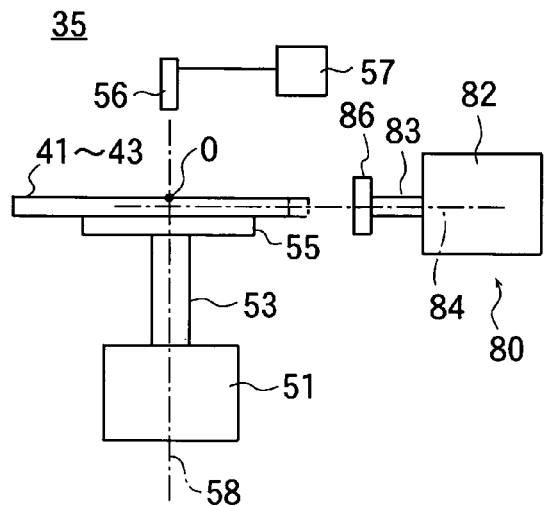
Fig. 14(a)　　　　　Fig. 14(b)
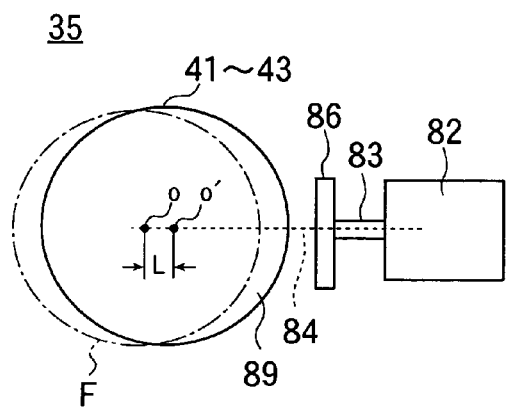
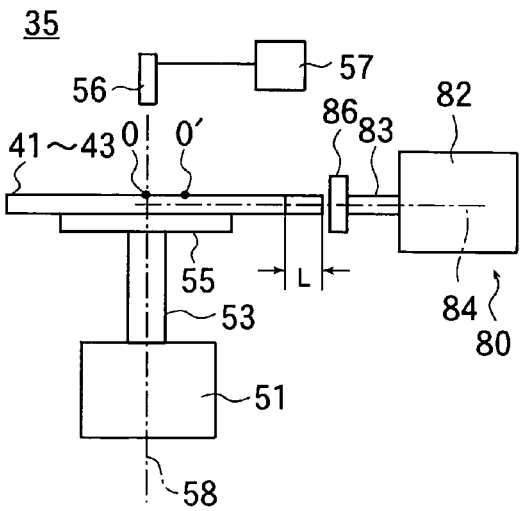
Fig. 15(a)　　　　　Fig. 15(b)

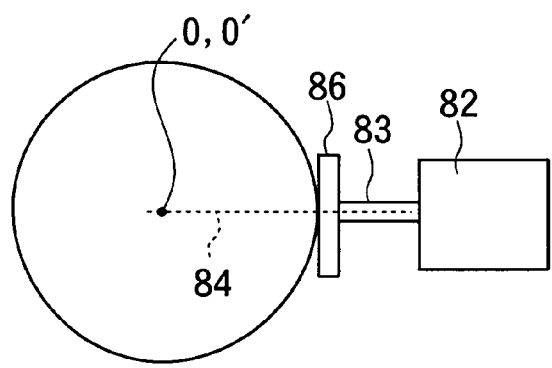
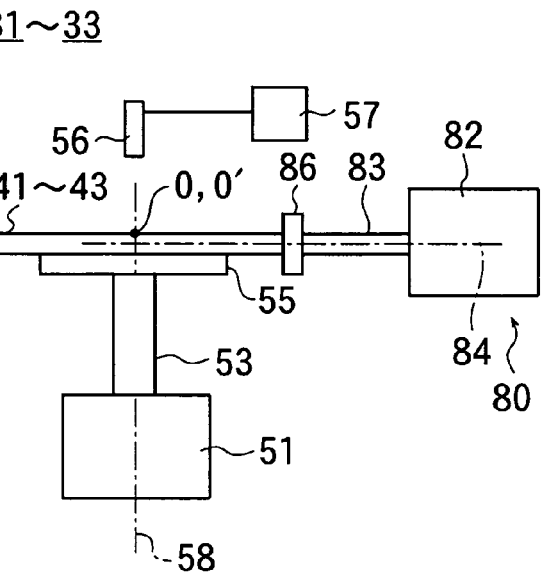
Fig. 16(a)　　　　　Fig. 16 (b)
Fig. 17
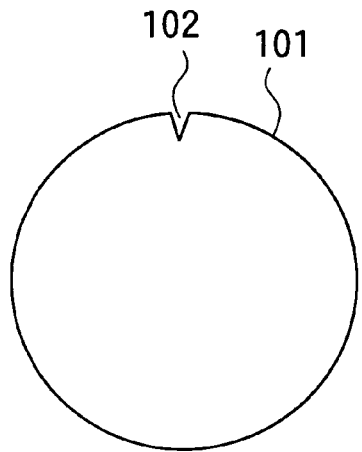

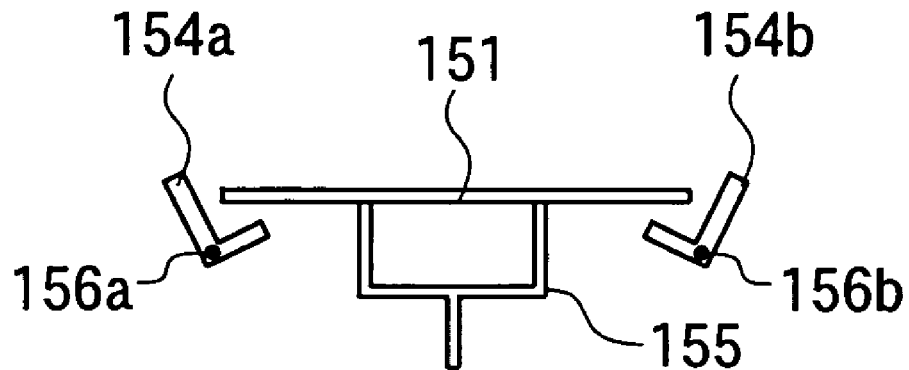
Fig. 19 (a)    PRIOR ART
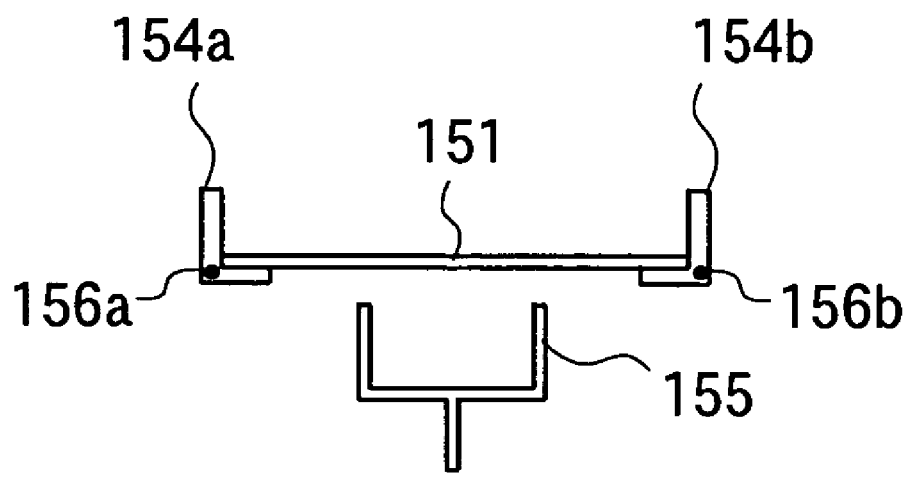
Fig. 19 (b)    PRIOR ART

POSITION CORRECTING APPARATUS, VACUUM PROCESSING EQUIPMENT AND POSITION CORRECTING METHOD

The present invention is a Continuation of International Application No. PCT/JP2006/312492 filed Jun. 22, 2006, which claims priority to Japan Patent Document No. 2005-185488, filed on Jun. 24, 2005. The entire disclosures of the prior applications are hereby incorporated by reference herein in their entireties

BACKGROUND

The present invention generally relates to conveyance technology, and more particularly to conveyance technology free from positional deviations.

As illustrated in FIG. 17, on a substrate 101 (such as, semiconductor wafer, etc.), a notch 102 indicating an orientation is formed at peripheral edge. In the case that the substrate 101 having the notch 102 is transferred by a transport robot, positional deviations will result.

In the case where a plurality of transport robots is used, errors are accumulated; thus, positional deviations of the substrate increase due to the following causes:

(1) in the case of significant number of delivery times of substrates;
(2) in the case of significant number of arms of transport robots, and variations occurring due to individual differences; and
(3) in the case where substrates happen to be directed toward different directions depending on positional relationship between delivery location and a plurality of transport robots.

In recent years, the number of processes that need to perform a high-accuracy centering of the substrate 101 and positioning of the notch 102 has been increased, and thus a problem of positional deviation of the substrate 101 cannot be neglected.

Also, an increase in effective area on the substrate is desired. For example, as an effective region where chips can be taken on the substrate 101, in a substrate having 200 mm in diameter, inner radius region of 5 mm or inside from the edge is regarded as an effective region. Although it was satisfactory if only the quality of film is ensured within the effective region, for a substrate having 300 mm in diameter, however, it is required that an inner radius region of 3 mm or less from the edge should be ensured as an effective region; accordingly, a permissible value of conveyance deviations becomes smaller.

In addition to a condition in which the inner radius region of 3 mm or less from the edge should be an effective region, in order that a substrate stage may not be exposed to the bottom surface of the notch 102, since the notch 102 has been notched by 1.5 mm, another condition in which conveyance precision of the substrate being within 1.5 mm must also be met. In complicated processes where superimposing of conveyance precisions frequently occurs, or in processes where positional deviations of the substrate 101 cannot be permitted, the need to perform a precise positioning of orientations of the notch 102 has also arisen.

A reference numeral 105 in FIG. 18 denotes a vacuum processing equipment of which a plurality of processing chambers 112 to 116, and 122 to 126 is connected to each other. In two sets of transport chambers 110 and 120, transport robots 118 and 128 are arranged, respectively, and the conveyance chambers 110 and 120 are connected via a delivery chamber 130.

A stand 131 is arranged within the delivery chamber 130. The objects to be transported are taken out from the processing chambers 112 to 116 by a transport robot 118 provided in the transport chamber 110 at one side and the objects are arranged on the stand 131, then the objects to be transported are carried in the processing chambers 122 to 126 connected to a transport chamber 120 at the other side by the transport robot 128 provided in the transport chamber 120 at the other side.

In this figure, reference numerals 141 to 143 denote objects to be transported held on the stand 131, the objects to be transported being substrates with notches formed thereon.

The transport robots 118 and 128 have hands 135a, 135b, 145a and 145b at the ends of telescopic arms 137 and 147, respectively. When the objects to be transported 141 to 143 are placed on the hands 135a, 135b, 145a and 145b, respectively, and arranged at different positions on the stand 131, the transport robots 118 and 128 extend the arms 137 and 147 by rotating the arms 137 and 147 around rotating shafts 119 and 129 as a center.

Thus, orientations of the hands 135a, 135b, 145a and 145b will not become parallel to each other when the objects to be transported 141 to 143 are arranged at different positions on the stand 131. For this reason, even if the notches 146 to 148 of the respective objects to be transported 141 to 143 arranged on the hands 135a, 135b, 145a and 145b of the transport robots 118 and 128 are faced toward a given direction, the notches 146 to 148 of the objects to be transported 141 to 143 arranged on the stand 131 will face different directions.

The orientation deviations of the notches 146 to 148 become more widened when the objects to be transported 141 to 143 are transferred from one to another of two sets of the transport robots 118 and 128.

In order to solve the above-mentioned drawbacks, there is an example in which a correcting and moving device for rotating the objects to be transported 141 to 143 is provided to correct the orientations of the notches 146 to 148; and the transport robot and the correcting and moving device are alternately operated to carry out positional corrections. There is a problem, however, in that the transport robot cannot transfer the substrates during the correction of substrate positions so that throughput is reduced.

Also, deviations of the central positions of the objects to be transported 141 to 143 in the delivery chamber 130 may present a problem. In the conventional art, a correction is made by means of a device as shown in FIGS. 19(a) and (b).

FIG. 19(a) illustrates a state in which a substrate 151 transferred from the transport robot and held on a pin 155 at a location having distance regulating members 154a and 154b positioned right and left. When the pin 155 is caused to fall, the substrate 151 comes into contact with the seating faces of the regulating members 154a and 154b, and the regulating members 154a and 154b rotate around center shafts 156a and 156b, thereby the side walls of the regulating members 154a and 154b become erect.

At this time, even if the substrate 151 is deviated to either right-hand or left-hand side, the substrate 151 is pressed against the side walls on their way to an erection, and then the substrate is moved to a position sandwiched between the side walls so that the deviation will be corrected.

In the case in which a mechanical centering is performed in this manner, the regulating members 154a and 154b come into contact with the substrate 151; and accordingly, there is a problem in that dust is produced. In addition, a positioning mechanism is difficult to adjust. This conventional art are disclosed in JPA 10-270533 and JPA 8-46013.

SUMMARY OF THE INVENTION

The present invention is not devised to solve the above-described prior art, but aims to provide a position correcting apparatus capable of correcting positions without operating transport robots, and to provide a position-correcting method.

Also, another object of the present invention is to provide a position correcting apparatus and a position-correcting method that do not produce dust.

Further, another object of the present invention is to provide a vacuum apparatus that can perform positioning using these position correcting apparatuses.

In order to solve the above problems, according to a first aspect of the present invention, a position correcting apparatus includes a holding stand for rotating object to be transported around a rotation-axis line as a center within a plane perpendicular to the rotation-axis line, a stand-elevating mechanism for moving the holding stand upward and downward, a temporary placing portion for temporarily placing the objects to be transported, and an oblique correcting and moving device for moving obliquely upward and downward the temporary placing portion inclined at a predetermined intersecting angle to the rotation-axis line.

According to another aspect of the present invention, there is provided a position correcting apparatus in which the rotation-axis line is vertically arranged, and the plane is made to be a horizontal plane.

According to still another aspect of the present invention, a position correcting apparatus is configured in that the upper part of the temporary placing portion located below the object to be transported on the holding stand can be in contact with the back surface of the objects to be transported arranged on the holding stand, and the surface of the holding stand located below the object to be transported arranged on the temporary placing portion can be in contact with the back surface of the objects to be transported arranged on the temporary placing portion.

According to still yet another aspect of the present invention, a position correcting apparatus has a detection device for detecting an error distance within the one plane between the center of the objects to be transported on the holding stand and the rotation-axis line, and an error angle formed by a straight line within the plane connecting between the center of the objects to be transported and the rotation-axis line, and a moving direction of the object to be transported within the plane moved by the oblique correcting and moving device, and a control device for controlling the holding stand and the oblique correcting and moving device to move the object to be transported and thus positioning the center of the object to be transported on the rotation-axis line.

According to a further aspect of the present invention, a position correcting apparatus has a holding stand for rotating the objects to be transported around a rotation-axis line as a center within a plane perpendicular to the rotation-axis line, a substrate-elevating mechanism for moving upward and downward the object to be transported at a position above the holding stand, a temporary placing portion for temporary placing the object to be transported, and an oblique correcting and moving device for moving the temporary placing portion obliquely upward and downward inclined at a predetermined intersecting angle to the rotation-axis line.

According to a still further aspect of the present invention, there is provided a position correcting apparatus in which the rotation-axis line is arranged vertically, and the plane is made to be a horizontal plane.

According to yet another aspect of the present invention, a position correcting apparatus is configured in that the upper part of the substrate-elevating mechanism located below the objects to be transported on the holding stand can be in contact with back surface of the objects to be transported arranged on the holding stand; and the upper part of the holding stand located below the object to be transported on the substrate-elevating mechanism can be in contact with the back surface of the object to be transported arranged on the substrate-elevating mechanism.

According to another aspect of the present invention, a position correcting apparatus has a detection device for detecting an error distance within the plane between the center of the object to be transported on the holding stand and the rotation-axis line, and an error angle formed by a straight line within the plane connecting between the center of the objects to be transported and the rotation-axis line, and a moving direction of the objects to be transported within the one plane moved by the oblique correcting and moving device, and a control device for controlling the holding stand and the oblique correcting and moving device to move the objects to be transported, and thereby positioning the centers of the objects to be transported on the rotation-axis line.

According to still another aspect of the present invention, a position correcting apparatus has a holding stand for rotating the objects to be transported around a rotation-axis line as a center within a plane perpendicular to the rotation-axis line, and an in-plane correcting and moving device for moving within the plane the object to be transported arranged on the holding stand.

According to still yet another aspect of the present invention, there is provided a position correcting apparatus in which the rotation-axis line is vertically arranged and the plane is made to be a horizontal plane.

According to a further aspect of the present invention, a position correcting apparatus has a detection device for detecting an error distance within the plane between the center of the object to be transported on the holding stand and the rotation-axis line, and an error angle formed by a straight line within the one plane connecting between the center of the objects to be transported and the rotation-axis line, and a moving direction of the object to be transported within the plane moved by the in-plane correcting and moving device, and a control device for controlling the holding stand and the in-plane correcting and moving device to move the object to be transported, and positioning the center of the objects to be transported on the rotation-axis line.

According to yet another aspect of the present invention, a vacuum processing equipment has a transport chamber, at least one processing chamber connected to the transport chamber, configured to enable to process the objects to be transported within a vacuum atmosphere, and a delivery chamber connected to the transport chambers, so that anyone of the above-mentioned position correcting apparatus is arranged.

According to an additional aspect of the present invention, a position-correcting method comprises the steps of detecting an error distance within the plane between the center of the objects to be transported arranged above the holding stand and the rotation-axis line, and an error angle formed by a straight line connecting between the center of the object to be transported and the rotation-axis line within a plane, and a moving direction of the object to be transported within the plane moved by the oblique correcting and moving device by using a holding stand for rotating the objects to be transported around a rotation-axis line as a center within the plane perpendicular to the rotation-axis line, and an oblique correcting and moving device for moving obliquely the objects to be transported with respect to the one plane, making a straight line connecting between the center of the object to be transported and the rotation-axis line within the one plane to be parallel to a moving direction of the object to be transported within the plane by the oblique correcting and moving device by rotating the holding stand by the error angle while the object to be transported rest on the holding stand, by moving the object to be transported to be moved by the oblique correcting and moving device so as to be equal a movement distance within the plane becomes to the error distance, thereby positioning the central position of the object to be transported on the rotation-axis line.

According to an additional aspect of the present invention, there is provided a position-correcting method in which the rotation-axis line is arranged vertically and the plane is made to be a horizontal plane.

According to still an additional aspect of the present invention, there is provided a position-correcting method in which the oblique correcting and moving device moves the object to be transported without contact with the surface of the holding stand.

According to an additional aspect of the present invention, a position-correcting method comprises the steps of detecting an error distance within a plane between the center of the object to be transported arranged above the holding stand and the rotation-axis line, and an error angle formed by a straight line connecting between the center of the objects to be transported and the rotation-axis line within the plane, and a moving direction of the object to be transported within the plane moved by the in-plane correcting and moving device using a holding stand for rotating the objects to be transported around a rotation-axis line as a center within one plane perpendicular to the rotation-axis line, and an in-plane correcting and moving device for moving the object to be transported within the plane, making a straight line connecting between the center of the object to be transported and the rotation axis line within horizontal plane to be parallel to a moving direction of the objects to be transported within the plane by rotating the holding stand while the object to be transported is arranged on the holding stand by the error angle and positioning the center of the objects to be transported on the rotation-axis line by the in-plane correcting and moving device by moving the objects to be transported so as to be zero of the error distance.

According to still an additional aspect of the present invention, a position-correcting method is provided in which the rotation-axis line is arranged vertically and the plane is made to be a horizontal plane.

With the above-described structural arrangements or features of the present invention, an oblique correcting and moving device or an in-plane correcting and moving device makes an object to be transported to rotate in a plane perpendicular to a rotation-axis line so as to make an error angle α formed between a component of a moving direction of a secondary shaft within a plane perpendicular to the rotation-axis line of a main shaft, and a line segment OO' connecting between the center of rotation O of a holding stand and the center O' of the objects to be transported within a plane perpendicular to the rotation-axis line to be 0° or 180°.

Next, in order to have a component of direction perpendicular to the line segment OO', the object to be transported is moved a distance in the plane perpendicular to the rotation-axis line to be equal to an error distance L of the line segment OO'. The rotation center O and the center O' of the object to be transported in the plane perpendicular to the rotation-axis line of the object are made to coincide.

It is noted that the center of ideal position of which object to be transported should be arranged may not coincide with the center of rotation of a holding stand. In this case, a distance between the center of ideal position and the center of the object to be transported before movement is an error distance, and all that needs to be done is to make the center of the object to be transported within a plane perpendicular to a rotation-axis line to coincide with an ideal center, rather than with the center of rotation.

Since the positional corrections can be performed without using transport robots, reduction of throughput can be avoided.

For the present invention, the transport robots having a high-accuracy positioning function is unnecessary, and an alignment using an inexpensive device becomes possible.

BRIEF DESCRIPTION OF THE DRAWINGS

FIGS. 4(a), 4(b) are views (3) for explaining an operation of the position correcting correction apparatus of the first example of the present invention.

FIGS. 5(a), 5(b) are views (4) for explaining an operation of the position correcting correction apparatus of the first example of the present invention.

FIGS. 6(a), 6(b) are views (5) for explaining an operation of the position correcting correction apparatus of the first example of the present invention.

FIGS. 7(a), 7(b) are views (6) for explaining an operation of the position correcting correction apparatus of the first example of the present invention.

FIGS. 8(a), 8(b) are views (1) for explaining an operation of a position correcting apparatus of a second example of the present invention.

FIGS. 9(a), 9(b) are views (2) for explaining an operation of the position correcting apparatus of the second example of the present invention.

FIGS. 12(a), 12(b) are views (5) for explaining an operation of the position correcting apparatus of the second example of the present invention.

FIGS. 13(a), 13(b) are views (6) for explaining an operation of the position correcting apparatus of the second example of the present invention.

FIGS. 14(a), 14(b) are views (1) for explaining an operation of a position correcting apparatus of s third example of the present invention.

FIGS. 15(a), 15(b) are views (2) for explaining an operation of the position correcting apparatus of the third example of the present invention.

FIGS. 16(a), 16(b) are views (3) for explaining an operation of the position correcting apparatus of the third example of the present invention.

FIG. 17 is an example of an object to be transported and a notch.

FIGS. 19(a) and 19(b) are examples of a position correcting apparatus of the conventional art.

DETAILED DESCRIPTION OF THE EMBODIMENTS

Figure 1:
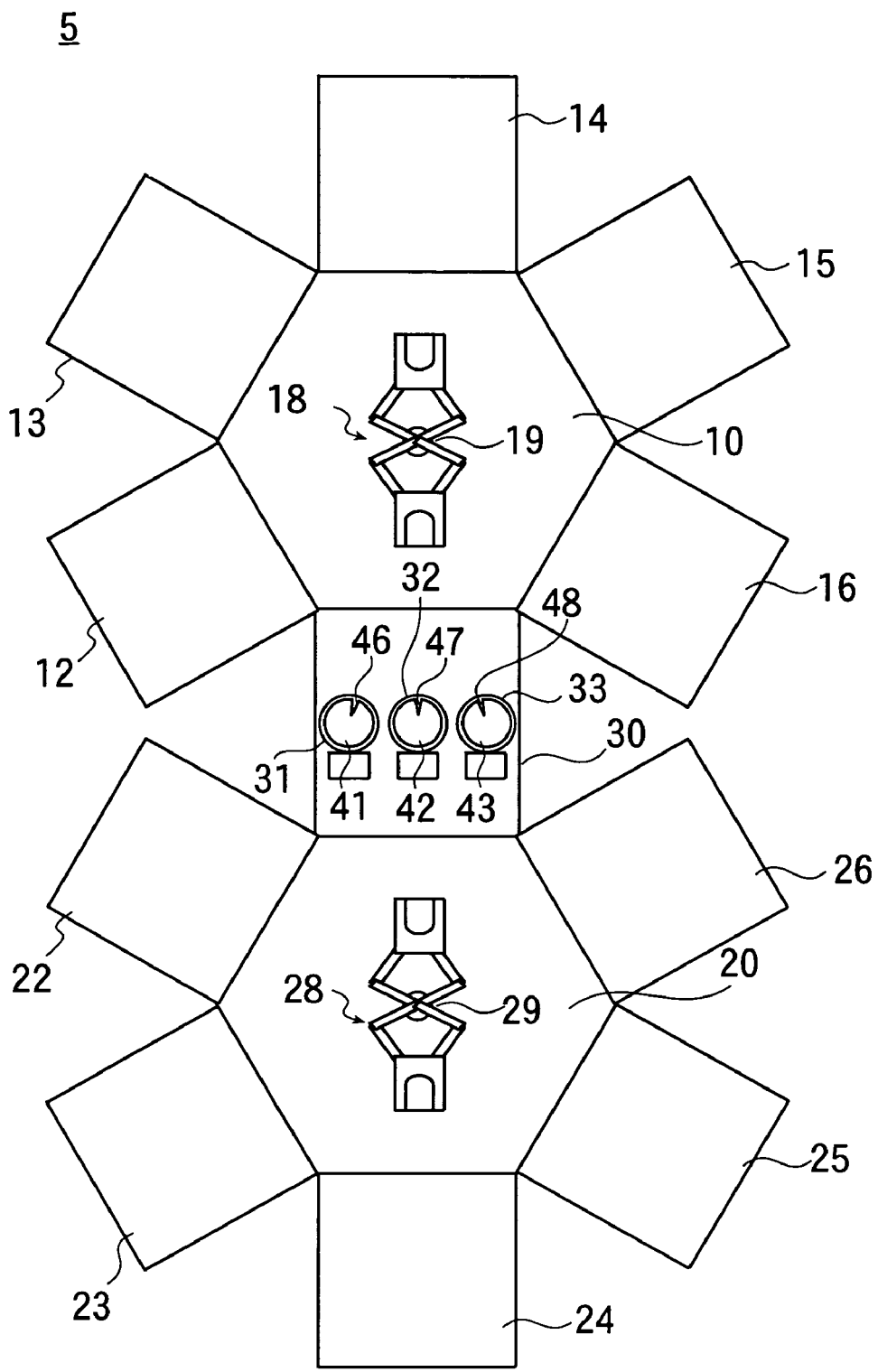
FIG. 1 is a view for explaining a vacuum processing equipment according to the present invention.

A reference numeral 5 in FIG. 1 denotes a vacuum processing equipment of one example of the present invention.

The vacuum processing equipment 5 has a delivery chamber 30 and two or more of transport chambers 10 and 20. Here, there are two transport chambers, and let one chamber denoted by a reference numeral 10 to be a first transport chamber, and the other chamber denoted by a reference numeral 20 to be a second transport chamber, the first and the second transport chambers 10 and 20 being respectively connected to the delivery chamber 30. A carrying-in chamber 12 and one or more sets of processing chambers 13 to 16 are connected to the first transport chamber 10. A carrying-out chamber 22 and one or more processing chambers 23 to 26 are connected to the second transport chamber 20.

A first transport robot 18 and a second transport robot 28 are arranged in the first and second transport chambers 10 and 20, respectively. The objects to be transported arranged in the carrying-in chamber 12 are taken out by a first transport robot 18; carried into the processing chambers 13 to 16; subsequent to processing, carried into the delivery chamber 30; taken out by a second transport robot 28; carried into the processing chamber 23 to 26; subsequent to processing, carried into a carrying-out chamber 22; and taken out to the outside of the vacuum processing equipment 5. The object to be transported is a substrate (such as, silicon wafers) and a notch is formed on a part of the substrate.

The processing operations performed at respective processing chambers 13 to 16 and 23 to 26 include, for example, cleaning, activation treatment of the objects to be transported by ultraviolet irradiation or plasma irradiation within a vacuum atmosphere; and for the other examples include thin film formation to the surfaces of the objects to be transported by sputtering process or vapor-deposition process, and etching by a plasma.

One or more position correcting apparatuses 31 to 33 of a first example of the present invention are arranged in the delivery chamber 30, and the objects to be transported that have been carried in the delivery chamber 30 are set at a predetermined locations on the position correcting apparatuses 31 to 33. Reference numerals 41 to 43 in FIG. 1 denote the objects to be transported that have been rested on the position correcting apparatuses 31 to 33.

FIGS. 2(a) and 2(b) to FIGS. 7(a) and 7(b) are drawings for explaining the position correcting apparatuses 31 to 33 of a first example, and a position-correcting method using the same. FIG. 8(a) to FIG. 13(a), and FIG. 14(a) to FIG. 16(a), as described later, are plan views of a second and a third position correcting apparatuses, and FIG. 8(b) to FIG. 13(b) and FIG. 14(b) to FIG. 16(b) are side views.

These position correcting apparatuses 31 to 33 have a main shaft 53 and a secondary shaft 63.

The main shaft 53 is arranged vertically, with the lower end thereof being attached to a rotating mechanism 51. The upper end of the main shaft 53 is attached to a holding stand 55, with the surface of the holding stand 55 being perpendicular to the main shaft 53, that is, horizontal. Reference numeral 58 denotes a central axis line of the main shaft 53, and is also a rotation-axis line of the holding stand 55. The rotation-axis line 58 is vertical.

When the holding stand 55 is rotated around the rotation-axis line 58 as a center by the rotating mechanism 51, the surface of the holding stand 55 is designed to rotate around the rotation-axis line 58 within a plane perpendicular to the main shaft 53, that is, within a horizontal plane.

A stand-elevating mechanism 52 is also attached to the main shaft 53. When the stand-elevating mechanism 52 is operated, the holding stand 55 can move upward and downward in a direction along a rotation-axis line 58, that is, in a vertical direction. Accordingly, the holding stand 55 is configured to be movable vertically upward and downward with its surface maintaining horizontal.

FIGS. 2(a) and 2(b) illustrate a state in which the object to be transported 41, 42 or 43 is arranged on the holding stand 55 by a first transport robot 18. Here, the center O' of the object to be transported 41, 42 or 43 is assumed to be spaced as an error distance L from the rotation-axis line 58, as illustrated in FIG. 2(a), for the purpose of explaining the present invention.

In this figure, reference numeral O is positioned within a plane perpendicular to the rotation-axis line 58 (horizontal plane), and is a point at which a straight line passing through the center O' of the object to be transported 41, 42 or 43 intersects the rotation-axis line 58; and also, it is the center of rotation of the holding stand 55. A line segment OO' connecting between the center O of rotation and the center O' of the object to be transported 41, 42 or 43 is positioned within a plane perpendicular to the rotation-axis line 58 (horizontal plane).

Next, the secondary shaft 63 is not parallel to the rotation-axis line 58 of the main shaft 53, and it is arranged obliquely. The lower end of the secondary shaft 63 is attached to an oblique moving mechanism 62. A temporary placing portion 66 is attached to the upper end of the secondary shaft 63, and in the position correcting apparatuses 31 to 33 of the first example, an oblique correcting and moving device 60 is comprised of an oblique moving mechanism 62, the secondary shaft 63, and the temporary placing portion 66.

The oblique moving mechanism 62 is configured to move the secondary shaft 63 along a parallel to the central axis line 68 so that its central axis line 68 may not be shifted. This is an oblique movement with respect to a plane perpendicular to the main shaft 53 (horizontal plane). As a result, the movement of the temporary placing portion 66 can be decomposed into a component of moving direction in the plane in which the oblique moving is projected to the plane (horizontal plane) perpendicular to the main shaft 53, and a component having a direction perpendicular to the former component, that is, vertical moving direction.

Let an angle between the central axis line 68 of the secondary shaft 63 and the rotation-axis line 58 of the main shaft 53 be defined as an intersecting angle $\beta$ ($\beta<90°$). When the temporary placing portion 66 moves by a distance T obliquely along the central axis line 68, a movement distance X of a component within a plane perpendicular to the rotation-axis line 58 of the temporary placing portion 66 is given by $X=T\cdot\sin\beta$, a moved distance Y of a component of vertical direction is given by $Y=T\cos\beta$. Regarding to this relationship, when the temporary placing portion 66 is required to move by a predetermined amount, in a direction perpendicular to the rotation-axis line 58, that is, in a horizontal direction, the amount of movement in an oblique direction which is the direction along the central axis line 68 of the secondary shaft 63 can be calculated.

Figure 2:
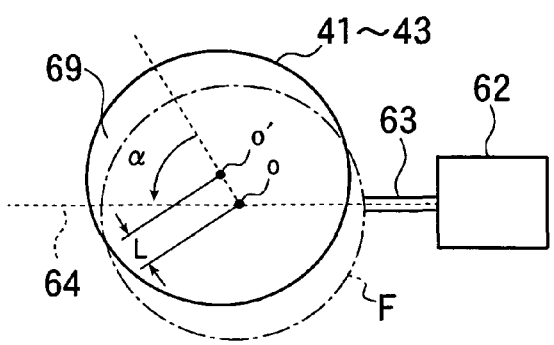
FIGS. 2(a), 2(b) are views (1) for explaining an operation of a position correcting apparatus of a first example of the present invention.
Figure 2:
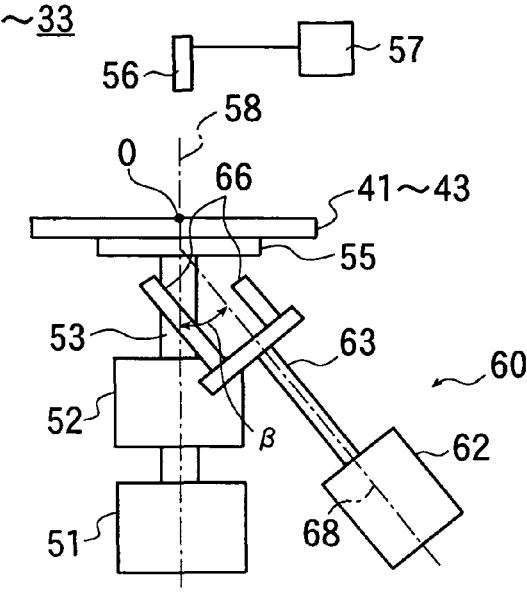

Reference numeral 64 in FIG. 2(*a*) denotes a moving direction within a plane perpendicular to the rotation-axis line 58 (horizontal plane), when the temporary placing portion 66 moves obliquely at an intersecting angle β.

The temporary placing portion 66 has one or more pins protruding obliquely upward or vertically upward, and the ends of the pins are located within the same plane perpendicular to the rotation-axis line 58 (horizontal plane), the pins are configured so as to be capable of putting a plate-shaped, or a disk-shaped object to be transported thereon.

In the state in which the first transport robot 18 holds the object to be transported 41, 42 or 43 on the holding stand 55, a line segment OO' connecting between the center O of rotation of the holding stand 55 and the center O' of the object to be transported 41, 42 or 43 is not parallel to a moving direction 64 of the temporary placing portion 66 within a plane perpendicular to the rotation-axis line 58 (horizontal plane).

Reference numeral α in FIG. 2(*a*) denotes an error angle between a line segment OO' and a moving direction 64 of the temporary placing portion 66 within a plane perpendicular to the rotation-axis line 58 (horizontal plane). Reference numeral F in each of FIG. 2(*a*) to FIG. 7(*a*) denotes an outline of an ideal position for the object to be transported 41, 42 or 43 arranged on the holding stands 55. If the center O of the rotation of the holding stand 55 fails to coincide with the center O' of the object to be transported 41 42 or 43, the object to be transported 41 42 or 43 partially extends off the outline F of an ideal position. Reference numerals 69 denote extending areas.

A detection device 56 is arranged over the holding stand 55. The detection device 56 is connected to a control device 57; and when photograph of the object to be transported 41, 42 or 43 on the holding stand 55 is taken, the control device is configured to analyze the results of the photographs, and calculate an error distance L and an error angle α.

The detection device 56 is an optical measuring instrument or a non-contact measuring instrument (such as, a CCD sensor, a displacement sensor, a LED sensor, a LED fiber sensor, etc.) and widely includes one that is capable of making a positional measurement.

Figure 3:
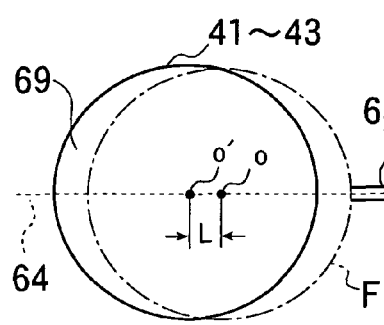
FIGS. 3(a), 3(b) are views (2) for explaining an operation of the position correcting correction apparatus of the first example of the present invention.
Figure 3:
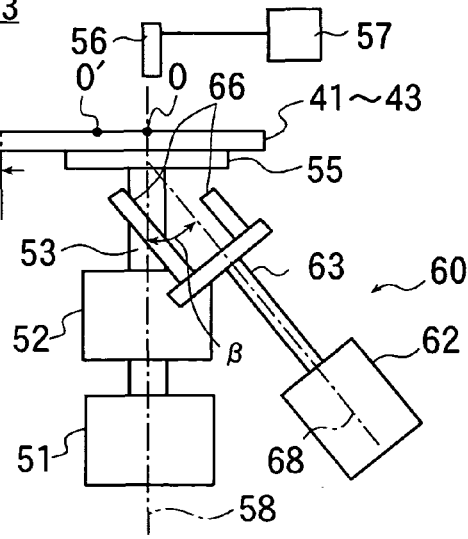
Figure 10:
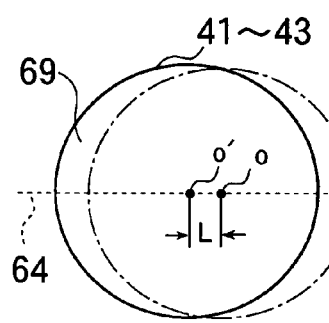
FIGS. 10(a), 10(b) are views (3) for explaining an operation of the position correcting apparatus of the second example of the present invention.
Figure 10:
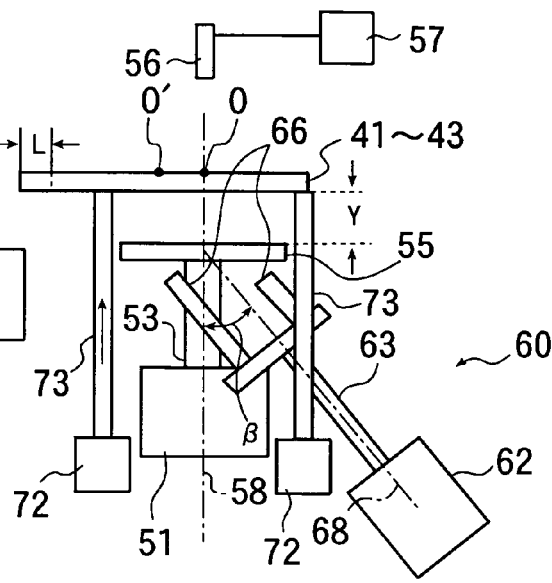
Figure 11:
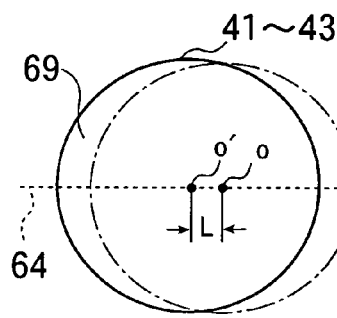
FIGS. 11(a), 11(b) are views (4) for explaining an operation of the position correcting apparatus of the second example of the present invention.
Figure 11:
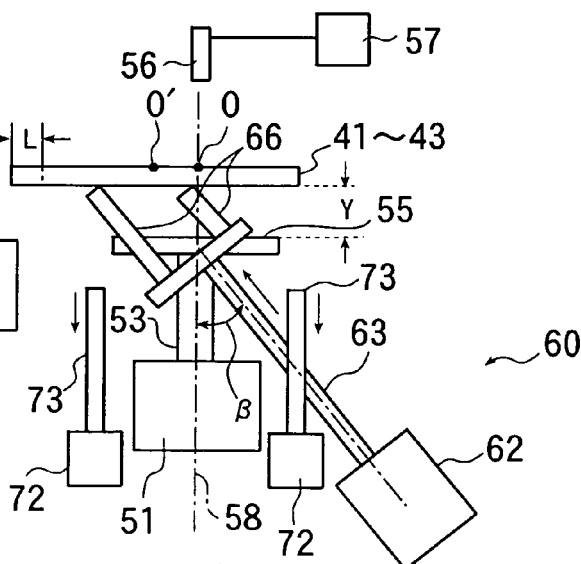
Figure 18:
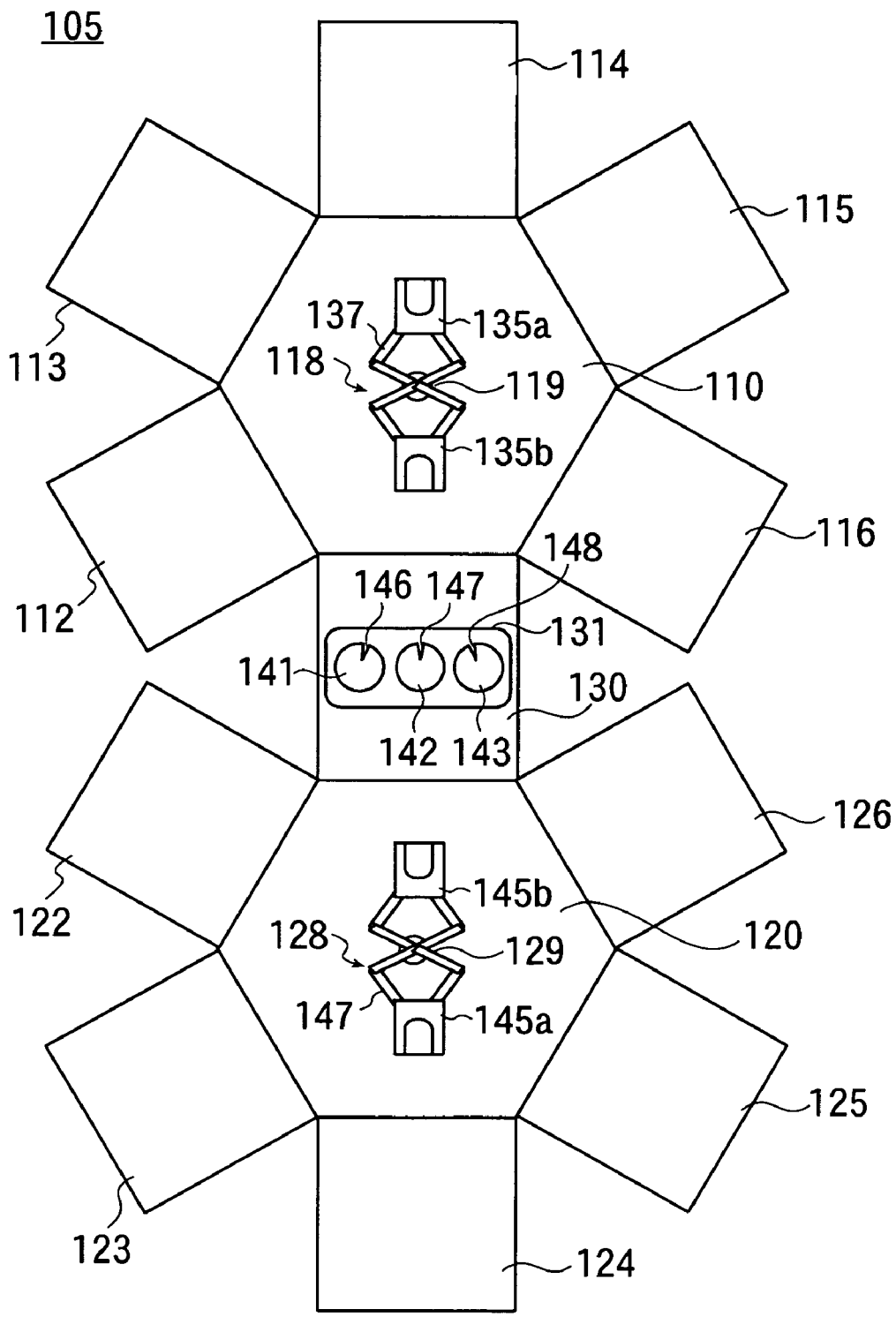
FIG. 18 is an example of a vacuum processing equipment of the conventional art.

In order to resolve positional deviation of the object to be transported 41 42 or 43 on the holding stand 55 and arrange them at an ideal position, the control device 57 controls the holding stand 55 to rotate, and so as to be parallel the line segment OO' to a moving direction 64 of the temporary placing portion 66 within a plane perpendicular to the rotation-axis line 58 (horizontal plane), or to coincide each other as illustrated in FIGS. 3(*a*), 3(*b*). As a result, an extending area 69 where the object to be transported 41, 42 or 43 extend off an ideal outline F faces a secondary shaft 63 side, or at the side opposite to the secondary shaft 63. In this state, an error angle α is zero degree or 180 degrees.

The temporary placing portion 66 is positioned beforehand under the holding stand 55. When the control device 57 activates the oblique moving mechanism 62 so as to obliquely extend the secondary shaft 63, the temporary placing portion 66 moves in an obliquely upward direction intersects a vertical direction, that is, in a direction of the rotation-axis line 58 at an intersecting angle β (β<90°).

The holding stand 55 is configured to enable the tip of the temporary placing portion 66 to touch the object to be transported 41, 42 or 43 on the holding stand 55 from their back surface, and when the temporary placing portion 66 comes into contact with the back surface of the object to be transported 41 42 or 43, the movement of the temporary placing portion 66 is stopped. FIGS. 4(*a*) and 4(*b*) illustrate this state.

For example, here, the size of the object to be transported 41, 42 or 43 is bigger than that of the holding stand 55, and the temporary placing portion 66 is designed to touch the back surface of the objects to be transported 41 to 43 that are in the outside portions from the peripheral edge of the holding stand 55.

Next, when a stand-elevating mechanism 52 is activated to cause the holding stand 55 to fall as illustrated in FIGS. 5(*a*) and (*b*), the back surface of the object to be transported 41, 42 or 43 is released from the surface of the holding stand 55, and comes to a rest on the temporary placing portion 66 in place of the holding stand 55.

In this state, the object to be transported 41, 42 or 43 has been moved from the holding stand 55 to the temporary placing portion 66, and the secondary shaft 63 is obliquely moved in such a direction that the center o' of the object to be transported 41, 42 or 43 comes closer to the center of rotation O of the holding stand 55.

In a case in which an extending area 69 off the ideal outline F of the object to be transported 41, 42 or 43 is closer to the secondary shaft 63 than the center of rotation O, and the center O' of the object to be transported 41, 42 or 43 is located between a lower end of the secondary shaft 63 and the center of rotation O of the holding stand 55, the secondary shaft 63 is extended.

To the contrary, in a case in which the extending area 69 off an ideal outline F is farther than the center of rotation with respect to the secondary shaft 63, and the center of rotation O of the holding stand 55 is positioned between the lower end of the secondary shaft 63 and the center O' of the object to be transported 41 42, or 43, the secondary shaft 63 is contracted.

Let an amount of oblique elongation or oblique contraction of the secondary shaft 63 at this time; that is, an obliquely moving distance $T_0$ of the object to be transported 41, 42 or 43 is to be defined by $T_0 = L/\sin \beta$. The objects to be transported 41 to 43 are moved by an error distance L within a plane perpendicular to the rotation-axis line 58 (horizontal plane) in a direction parallel to a line segment OO'; and as a result, the center O' of the object to be transported 41, 42 or 43 is placed on the rotation-axis line 58, as illustrated in FIGS. 6(*a*) and 6(*b*).

In this state, as illustrated in FIGS. 7(*a*), (*b*), when the holding stand 55 rises, and the surface of the holding stand 55 is brought into contact with the back surface of the object to be transported 41, 42 or 43, then the holding stand 55 rises further, and the object to be transported 41, 42 or 43 is released from the temporary placing portion 66, and are moved from on the temporary placing portion 66 onto the holding stand 55. At this time, the center O' of the objects to be transported 41 to 43 coincides with the center of rotation O of the holding stand 55.

In this state, the objects to be transported 41 to 43 can be transferred without any error by a second transport robot 28 from the inside of a delivery chamber 30 into a second transport chamber 20.

Notches 46 to 48 are formed on the objects to be transported 41 to 43. If a relative positional relationship between the objects to be transported 41 to 43 and a hand of a second transport robot 28 is fixed; orientation of the notch 46, 47 or 48 is detected by the detection device 56; the center O' of the object to be transported 41, 42 or 43 is made to coincide with the center of rotation O of the holding stand 55; and thereafter, the object to be transported 41, 42 or 43 is rotated by a desired angle; and thus, the notches 46 to 48 can be directed toward a desired orientation. For example, the notches 46 to 48 can be located on a line connecting between the center of the objects to be transported 41 to 43, and a rotation-axis line 29 of an arm of the second transport robot 28.

The above description is directed to a case in which the holding stand 55 moves upwardly and downwardly to transfer and hold the object to be transported 41, 42 or 43, but the present invention is not limited thereto.

Reference numerals 34 in FIGS. 8(a) and 8(b) to FIGS. 13(a) and 13(b) denote position correcting apparatuses of a second example of the present invention, which can be arranged in the delivery chamber 30 in place of the above-mentioned position correcting apparatuses 31 to 33 of the first example.

Description will be made using the same reference numerals designated to the same members as those of the position correcting apparatuses 31 to 33 of the first example. In this position correcting apparatus 34, the main shaft 53 is arranged vertically, and the lower end of which is attached to a rotating mechanism 51 in a similar manner to in the position correcting apparatuses 31 to 33 of the first example.

The holding stand 55 is attached horizontally to the upper end of the main shaft 53; and when the rotating mechanism 51 is activated, the holding stand 55 is configured to rotate within a plane perpendicular to the rotation-axis line 58 (horizontal plane) around the rotation-axis line 58 as a center of the main shaft 53. Also, in a similar manner to the first example, the position correcting apparatus 34 has an oblique correcting and moving device 60, and when the secondary shaft 63 is obliquely moved, the temporary placing portion 66 is configured to move in an oblique direction that forms an intersecting angle β to the rotation-axis line 58.

On the other hand, unlike the position correcting apparatuses 31 to 33 of the first example, a stand-elevating mechanism is not provided to a main shaft 53 in a position correcting apparatus 34 of a second example; and thus the main shaft 53 does not move upwardly and downwardly. However, a plurality of pins 73 is arranged vertically as a substitute for this, and the pins 73 are configured to be moved upwardly and downwardly by a substrate-elevating mechanism 72 provided at the lower ends of respective pins 73.

In the case for correcting the position of the object to be transported 41, 42 or 43 on the holding stand 55 using the position correcting apparatus 34, first, the holding stand 55 is rotated by an error angle α; and, as illustrated in FIGS. 9(a) and 9(b), a line segment OO' connecting between the center of rotation O and the center O' of the object to be transported 41, 42 or 43 is made to be parallel to a moving direction 64 of the temporary placing portion 66 within a plane perpendicular to the rotation-axis line 58 (horizontal plane). As a result, an error angle α becomes 0° or 180°.

While the pins 73 are arranged lower than the holding stand 55, and the object to be transported 41, 42 or 43 is placed on the holding stand 55, when the pins 73 are made to rise, the top of the pins 73 are configured to touch the back surface of the object to be transported 41, 42 or 43.

For example, through-holes may be provided in the holding stand 55 so as to enable the pins 73 to pass through the holes, or the size of the holding stand 55 may be made to be smaller than that of the objects to be transported 41 to 43, and upper ends of the pins 73 may touch the back surface of the object to be transported 41, 42 or 43 located in an outer side of peripheral edge of the holding stand 55.

The upper ends of respective pins 73 are designed to come into contact with the back surface of the object to be transported 41, 42 or 43 at least three points.

When the pins 73 are made to rise further in this state, the object to be transported 41, 42 43 is transported from the holding stand 55 and placed on the pins 73, as illustrated in FIGS. 10(a) and 10(b).

When the temporary placing portion 66 is located under the object to be transported 41, 42 or 43 arranged on the pins 73, and the secondary shaft 63 is extended, and the temporary placing portion 66 is made to rise obliquely, the upper ends of the temporary placing portion 66 are configured to come into contact with the back surface of the objects to be transported 41 to 43. Upon coming into contact, when the movement of the temporary placing portion 66 is stopped, and the pins 73 are made to fall, as illustrated in FIGS. 11(a) and 11(b), the object to be transported 41, 42 or 43 is transported and placed on the temporary placing portion 66.

At this time, in a case in which an extending area 69 off an ideal outline F is farther than the center of rotation from the secondary shaft 63 and the center of rotation O of the holding stand 55 is located between the lower ends of the secondary shaft 63 and the center O' of the object to be transported 41, 42 or 43, the secondary shaft 63 is contracted by an oblique moving mechanism 62, in order to make the center O' of the objects to be transported 41 to 43 to be closer to the center of rotation O of the holding stand 55; thus, the object to be transported 41, 42 or 43 is made to fall obliquely, while keeping an intersecting angle β.

If a magnitude of a component of an oblique movement by the temporary placing portion 66 within a plane perpendicular to the rotation-axis line 58 (horizontal component) is an error distance L, the center O' of the object to be transported 41, 42 or 43 rests on the central axis line 58; thus, a moving distance Y resulting from the rise of the pins 73 is provided by $Y=T_0 * \cos \beta$ (where $T_0=L/\sin \beta$).

FIGS. 12(a) and 12(b) illustrate a state in which the temporary placing portion 66 has fallen obliquely by a distance $T_0$ and the objects to be transported 41 to 43 has come into contact with the holding stand 55, with its center O' coinciding with the center of rotation O.

FIGS. 13(a) and 13(b) illustrate a state in which the temporary placing portion 66 has fallen further, and the objects to be transported 41 to 43 have been transported to place on the holding stand 55.

Further, in order to adjust further orientations of the notches 46 to 48, the holding stand 55 is rotated by a desired amount after the center O' of the object to be transported 41, 42 or 43 coincides with the center of rotation o of the holding stand 55.

On the other hand, in a case in which an extending area 69 is present at the secondary shaft 63 side, and the center O' of the object to be transported 41, 42 or 43 is positioned between the lower end of the secondary shaft 63 and the center of rotation O of the holding stand 55, in order to make the center O' of the objects to be transported 41 to 43 come closer to the center of rotation O of the holding stand 55, a line segment OO' connecting between the center of rotation O and center O' of the objects to be transported 41, 42 or 43 is made parallel to a moving direction 64 of the temporary placing portion 66 within a plane perpendicular to the rotation-axis line 58 (horizontal plane); and thereafter, the temporary placing portion 66 is made to rise obliquely, the upper ends of the temporary placing portion 66 come into contact with the back surface of the object to be transported 41, 42 or 43 on the pins 73, the objects to be transported 41 to 43 are transferred from the holding stand 55 and placed on the temporary placing portion 66. Further, the temporary placing portion 66 are caused to rise in an obliquely upward direction to move by a distance $T_0$ (=L/sin β) in oblique direction parallel to the central axis line 68 of the secondary shaft 63.

By this movement, the center O' of the object to be transported 41, 42 or 43 becomes positioned on the central axis line 58. Next, when the object to be transported 41, 42 or 43 is transported from the temporary placing portion 66 to be placed on the pins 73 by moving the pins 73 upward, the object to be transported 41, 42 or 43 is made to rest on the holding portion 55 by falling the temporary placing portion 66 to withdraw it; and thereafter, the pins 73 fall and then the center O' of the object to be transported 41, 42 or 43 coincides with the center of rotation O of the holding stand 55.

As described above, the object to be transported 41, 42 or 43 is moved by an error distance L without contact with the holding stand 55. In a case in which a movement is allowed while contacting therewith, a correcting and moving device may however move the object to be transported 41, 42 or 43 in a direction perpendicular to the rotation-axis line 58 (horizontal direction).

Reference numerals 35 in FIGS. 14(*a*) and 14(*b*) to FIGS. 16(*a*) and 16(*b*) denote a position correcting apparatus of a third example of the present invention.

This position correcting apparatus 35 is also configured such that the main shaft 53 is disposed, vertically, to the lower end of which is attached a rotating mechanism 51; and the holding stand 55 at the upper end thereof rotates within a plane perpendicular to the rotation-axis line 58 (horizontal plane), but has neither a stand-elevating mechanism nor a substrate-elevating mechanism.

In the position correcting apparatus 35 of a third example, a secondary shaft 83 is arranged by the side of holding stand 55. The center-axis line 84 of the secondary shaft 83 is arranged perpendicular to the rotation-axis line 58. A pressing member 86 is attached at the end of the secondary shaft 83 facing the holding stand 55 side.

An opposite end of the secondary shaft 83 is connected to a horizontal moving mechanism 82. An in-plane correcting and moving device 80 for moving the objects to be transported 41 to 43 in a direction perpendicular to the rotation-axis line 58 (horizontal direction) is composed of the horizontal moving mechanism 82, the secondary shaft 83, and the pressing member 86.

FIGS. 14(*a*) and (*b*) illustrate a state in which the objects to be transported 41 to 43 are made to rest on the holding stand 55 by the first transport robot 18. In a similar manner to the above cases, the center O' of the objects to be transported 41 to 43 has positional deviation by an error angle α and an error distance L with respect to the center O of the holding stand.

A procedure for correcting positional deviation using this position correcting apparatus 35 is described below. A holding stand 55 is used that is one with a size equal to that of the objects to be transported 41 to 43, or smaller than that of the objects to be transported 41 to 43. Further, in a state that positional deviation have developed, an area of the outline of the object to be transported 41, 42 or 43 extends off an ideal outline F also extends off the holding stand 55. Reference numerals 89 in FIG. 14(*a*) and FIG. 15(*a*) denote extending-off areas.

The object to be transported 41, 42 or 43 is observed by the detection device 56, and the holding stand 55 is rotated by a control device 57 in a direction that an extending-off area 89 is located between the holding stand 55 and the pressing member 86. At this time, as illustrated in FIG. 15(*a*), 15(*b*), a line segment OO' connecting between the center of rotation O of the holding stand 55 and the center O' of the object to be transported 41, 42 or 43 is made to be parallel to the center axis line 84 of the secondary shaft 83. In this state, an error angle α becomes 0°. Even if the line segment OO' does not coincide with the central axis line 84 in height direction, they are only required to be parallel to each other.

At this state, the center O' of the object to be transported 41, 42 or 43 is located between the center of rotation O of the holding stand 55 and the pressing member 86, a horizontal moving mechanism 82 is activated to extend the secondary shaft 83, and the pressing member 86 is made to come into contact with the object to be transported 41, 42 or 43.

Further, when the object to be transported 41, 42 or 43 is moved by an error distance L in a direction parallel to the central axis line 84 of the secondary shaft 83 (that is, in a direction parallel to a line segment OO' by extending the secondary shaft 83), and pressing the musing the pressing member 86, then the center O' of the object to be transported 41, 42 or 43 coincides with the center of rotation O of the holding stand 55, thereby resolving any errors (FIGS. 16(*a*) and 16(*b*)).

It should be noted that, if orientations of the notches on the objects to be transported 41 to 43 are desired to be corrected, the holding stand 55 may be further rotated by a desired angle.

It should be noted that the main shaft 53 is arranged vertically in the above respective examples, but the present invention is not limited thereto.

What is claimed is:

1. A non-dust generating position-correcting apparatus for any size object to be transported, comprising:
    a holding stand for rotating the object to be transported around a rotation-axis line as a center within a one plane perpendicular to the rotation-axis line;
    a stand-elevating mechanism for moving the holding stand in a direction along the rotation-axis line;
    a temporary placing portion for temporary placing the object to be transported;
    an oblique correcting and moving device for moving the temporary placing portion along an oblique upward and downward direction which is inclined at a predetermined intersecting angle to the rotation-axis line; and
    wherein, in such a state that a center of the object to be transported is placed on the rotation-axis line, the object to be transported on the temporary placing portion is moved to the holding stand.

2. The position correcting apparatus according to claim 1, wherein the rotation-axis line is vertically arranged, and the one plane is made to be a horizontal plane.

3. The position correcting apparatus according to claim 1, in which:
    a top of the temporary placing portion located below the object to be transported on the holding stand is contactable with the back surface of the object to be transported arranged on the holding stand,
    wherein the surface of the holding stand located below the object to be transported arranged on the temporary placing portion is capable of being in contact with the back surface of the object to be transported arranged on the temporary placing portion.

4. The position-correcting apparatus according to claim 1, further comprising:
    a detection device for detecting an error distance within the one plane between the center of the object to be transported on the holding stand and the rotation-axis line, and an error angle formed by a straight line within the one plane connecting between the center of the object to be transported and the rotation-axis line, and a moving direction of the object to be transported within the one plane moved by the oblique correcting and moving device; and a control device for controlling the holding stand and the oblique correcting and moving device to move the object to be transported, and thus positioning the centers of the object to be transported on the rotation-axis line.

5. A vacuum processing equipment, comprising:
a transport chamber;
at least one processing chamber connected to the transport chamber for processing the object to be transported in a vacuum atmosphere; and
a delivery chamber, connected to the transport chamber, where at least one position correcting apparatus according to claim 1 is arranged.

6. A non-dust generating position-correcting apparatus for any size object to be transported, comprising:
a holding stand for rotating the object to be transported around a rotation-axis line as a center within a one plane perpendicular to the rotation-axis line;
a substrate-elevating mechanism for moving the object to be transported in a direction along the rotation-axis line at a position above the holding stand;
a temporary placing portion for temporary placing the object to be transported;
an oblique correcting and moving device for moving the temporary placing portion along an oblique upward and downward direction which is inclined at a predetermined intersecting angle to the rotation-axis line; and
wherein, in such a state that a center of the object to be transported is placed on the rotation-axis line, the object to be transported on the temporary placing portion is moved to the holding stand.

7. The position-correcting apparatus according to claim 6, wherein the rotation-axis line is arranged vertically, and the one plane is made to be a horizontal plane.

8. The position correcting apparatus according to claim 6, wherein a top of the substrate-elevating mechanism located below the object to be transported arranged on the holding stand is capable of being in contact with a back surface of the object to be transported arranged on the holding stand, and
wherein a top of the holding stand located below the object to be transported arranged on the substrate-elevating mechanism is capable of being in contact with the back surface of the object to be transported arranged on the substrate-elevating mechanism.

9. The position-correcting apparatus according to claim 6, further comprising:
a detection device for detecting an error distance within the one plane between the center of the object to be transported on the holding stand and the rotation-axis line, and an error angle formed by a straight line within the one plane connecting between the center of the object to be transported and the rotation-axis line, and a moving direction of the object to be transported, along the oblique upward and downward direction which is inclined at a predetermined intersecting angle to the rotation-axis line, within the one plane moved by the oblique correcting and moving device; and
a control device for controlling the holding stand and the oblique correcting and moving device to move the object to be transported, and thus positioning the centers of the object to be transported on the rotation-axis line.

10. A non-dust generating position-correcting method to transport any size object, comprising the steps of:
detecting an error distance within a one plane between a center of object to be transported arranged on a holding stand and a rotation-axis line, and an error angle formed by a straight line connecting between the center of the object to be transported and the rotation-axis line within the one plane, and a moving direction of the object to be transported within the one plane moved by an oblique correcting and moving device, by using the holding stand for rotating the object to be transported around the rotation-axis line within the one plane perpendicular to the rotation-axis line, and the oblique correcting and moving device for moving obliquely the object to be transported with respect to the one plane;
making the straight line connecting between the center of the object to be transported and the rotation-axis line within the one plane to be parallel to the moving direction of the object to be transported within the one plane by the oblique correcting and moving device by rotating the holding stand for the error angle while the object to be transported rests on the holding stand; and
positioning the central position of the object to be transported on the rotation-axis line by moving the object to be transported by the oblique correcting and moving device so as to be equal to a moved distance within the one plane to the error distance.

11. The position-correcting method according to claim 10, wherein the rotation-axis line is arranged vertically and the one plane is made to be a horizontal plane.

12. The position-correcting method according to claim 10, wherein the oblique correcting and moving device moves the object to be transported without contact with the surface of the holding stand.

13. A non-dust generating position-correcting method to transport any size object, comprising the steps of:
using a position-correcting apparatus including:
a holding stand for rotating an object to be transported around a rotation-axis line as a center within a plane perpendicular to the rotation-axis line,
a stand-elevating mechanism for moving the holding stand upward and downward along the rotation axis,
a temporary placing portion for temporary placing the object to be transported, and
an oblique correcting and moving device inclined at a predetermined intersecting angle to the rotation-axis line for moving obliquely upward and downward the temporary placing portion;
performing an alignment, by rotating the holding stand, of:
(a) the direction of a line segment extending between the center of the object to be transported which is arranged on the holding stand and the rotation-axis line, and (b) the direction of a component of oblique movement of the holding stand on the plane;
arranging the object to be transported on the temporary placing portion in the above-explained state; and
after positioning the center of the object to be transported on the rotation axis by moving the temporary placing portion, arranging the object to be transported on the holding stand by moving the holding stand.

14. The position-correcting method according to claim 13, wherein the plane is made to be horizontal.

* * * * *